US012681380B2

(12) United States Patent
Wu et al.

(10) Patent No.: US 12,681,380 B2
(45) Date of Patent: Jul. 14, 2026

(54) LAYOUT AND PHOTOMASK

(71) Applicant: Fujian Jinhua Integrated Circuit Co., Ltd., Quanzhou City (CN)

(72) Inventors: Weiwei Wu, Quanzhou City (CN); Hsiang-Yu Hsieh, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 915 days.

(21) Appl. No.: 17/982,530

(22) Filed: Nov. 8, 2022

(65) Prior Publication Data

US 2023/0061510 A1      Mar. 2, 2023

Related U.S. Application Data

(63) Continuation of application No. 17/210,469, filed on Mar. 23, 2021, now Pat. No. 11,506,970.

(30) Foreign Application Priority Data

| Jan. 19, 2021 | (CN) | .......................... | 202110070645.2 |
| Jan. 19, 2021 | (CN) | .......................... | 202120143498.2 |

(51) Int. Cl.

| G06F 30/398 | (2020.01) |
| G03F 1/36 | (2012.01) |
| H10P 76/20 | (2026.01) |

(52) U.S. Cl.
CPC .............. *G03F 1/36* (2013.01); *G06F 30/398* (2020.01); *H10P 76/2041* (2026.01)

(58) Field of Classification Search
CPC ....... G03F 1/36; G06F 30/398; H01L 21/0274
See application file for complete search history.

(56) References Cited

U.S. PATENT DOCUMENTS

| 7,698,665 | B2 | 4/2010 | Abrams | |
| 10,204,197 | B2 | 2/2019 | Voznesenskiy | |
| 10,816,894 | B2 | 10/2020 | Li | |
| 11,361,139 | B2 | 6/2022 | Iverson | |
| 2006/0081991 | A1* | 4/2006 | Seta .................... | H01L 23/5222 |
| | | | | 257/758 |
| 2009/0239160 | A1* | 9/2009 | Miyajima ................. | G03F 1/68 |
| | | | | 430/30 |
| 2011/0186744 | A1 | 8/2011 | Anze | |
| 2016/0133522 | A1* | 5/2016 | Kang ................ | H01L 21/76816 |
| | | | | 438/283 |
| 2020/0110204 | A1 | 4/2020 | Weidmann | |
| 2022/0130828 | A1 | 4/2022 | Yan | |

FOREIGN PATENT DOCUMENTS

JP            9-34097 A      2/1997

* cited by examiner

*Primary Examiner* — Jack Chiang
*Assistant Examiner* — Brandon Bowers
(74) *Attorney, Agent, or Firm* — Winston Hsu

(57) ABSTRACT

The present disclosure provides a photomask and a method of forming a photomask, in which the photomask may obtain an optimized uniformity via a simplified process flow. The photomask includes a plurality of stair-like patterns parallel disposed with each other, wherein each of the stair-like patterns includes a plurality of first right angles at one side and a plurality of second right angle at another side opposite to the side, and each of the first right angles and each of the second right angles are not in a same vertical axis.

20 Claims, 11 Drawing Sheets

LAYOUT AND PHOTOMASK

CROSS REFERENCE TO RELATED APPLICATIONS

This application is a continuation application of U.S. application Ser. No. 17/210,469, filed on Mar. 23, 2021. The content of the application is incorporated herein by reference.

BACKGROUND OF THE INVENTION

1. Field of the Invention

The present disclosure relates to a layout and a photomask, and more particularly, to a layout and a photomask being formed by using an optical proximity correction (OPC) process.

2. Description of the Prior Art

In semiconductor manufacturing processes, in order to transfer an integrated circuit layout onto a semiconductor wafer, the integrated circuit layout is first designed and formed as a photomask pattern. The photomask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern. Currently, a technical called "optical proximity correction (OPC)" is developed. The OPC method is to imitate the feature that light passes through the photomask and to further compensate the pattern of the mask to form the desired pattern after the exposure process.

However, the current OPC method is less efficiently in forming the photomasks for linear patterns. This will increase the roughness of the pattern edges, leading to poor functions of the device it forms. Therefore, it is necessary to provide a new method for forming photomasks.

SUMMARY OF THE INVENTION

One of the objectives of the present disclosure provides a layout and a photomask, in which the layout and the photomask are formed through establishing the peripheral of a stair-like contour, so as to improve the roughness of the pattern edge, and also to reduce the processed data number and processing time.

To achieve the purpose described above, one embodiment of the present disclosure provides a layout including at least one first pattern. The first pattern includes a first stair-like edge and a second stair-like edge opposite to the first stair-like edge, wherein the first stair-like edge comprises a plurality of first right angles, the second stair-like edge comprises a plurality of second right angles, and one of the first right angles and one of the second right angles nearest thereto are not at a same axis.

To achieve the purpose described above, one embodiment of the present disclosure provides a photonomask including at least one first pattern. The first pattern includes a first stair-like edge and a second stair-like edge opposite to the first stair-like edge, wherein the first stair-like edge comprises a plurality of first right angles, the second stair-like edge comprises a plurality of second right angles, and one of the first right angles and one of the second right angles nearest thereto are not at a same axis.

To achieve the purpose described above, one embodiment of the present disclosure provides a method of forming a photomask including the following steps. Firstly, a first pattern is obtained to be implemented by a computer, wherein the first pattern is corresponded to a target layout and includes an oblique feature having two opposite edges. Then, a plurality of fragment breaks is defined on the oblique feature, each of the fragment breaks having four endpoints on the two opposite edges, and a plurality of first dummy quadrilaterals is identified at one of the two opposite edges, and a plurality of second dummy quadrilaterals is identified at another one of the two opposite edges, wherein each of the first dummy quadrilaterals and each of the second dummy quadrilaterals being identified by marking any two adjacent endpoints at the same edge as a diagonal line of a dummy square. Next, all of first dummy quadrilaterals are shifted by a first distance in a first direction, to obtain a plurality of first quadrilaterals, and all of the second dummy quadrilaterals are shifted by a second distance in a second direction opposite to the first direction, to obtain a plurality of second quadrilaterals. After that, an un-overlapping fragment between the first pattern, the first quadrilaterals and the second quadrilaterals is removed, and a first stair-like contour and a second stair-like contour is established by the computer through the first quadrilaterals and the second quadrilaterals respectively. Following these, the first stair-like contour and the second stair-like contour are outputted to form a photomask, and a photolithograph process is then formed on a substrate, through the photomask to form a first structure over the substrate.

These and other objectives of the present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic diagrams illustrating a method of forming a photomask according to a second embodiment of the present disclosure, in which:

FIG. 2 shows a pattern after defining fragment breaks by a computer system;

FIG. 3 shows a pattern after identifying dummy quadrilaterals by a computer system;

FIG. 4 shows a pattern after forming quadrilaterals by a computer system;

FIG. 5 shows a pattern after identifying and removing an un-overlapping fragment;

FIG. 6 shows a pattern after establishing stair-like contours; and

FIG. 7 shows a pattern after forming a photomask.

FIGS. 9-14 are schematic diagrams illustrating a method of forming a photomask according to a third embodiment of the present disclosure, in which:

FIG. 9 shows a pattern after shifting established stair-like contours;

FIG. 10 shows a pattern after forming a photomask;

FIG. 11 shows a pattern after expanding a length of established stair-like contours;

FIG. 12 shows a pattern after forming another photomask;

FIG. 13 shows a pattern after expanding a height of established stair-like contours; and FIG. 14 shows a pattern after forming another photomask.

DETAILED DESCRIPTION

Figure 1:
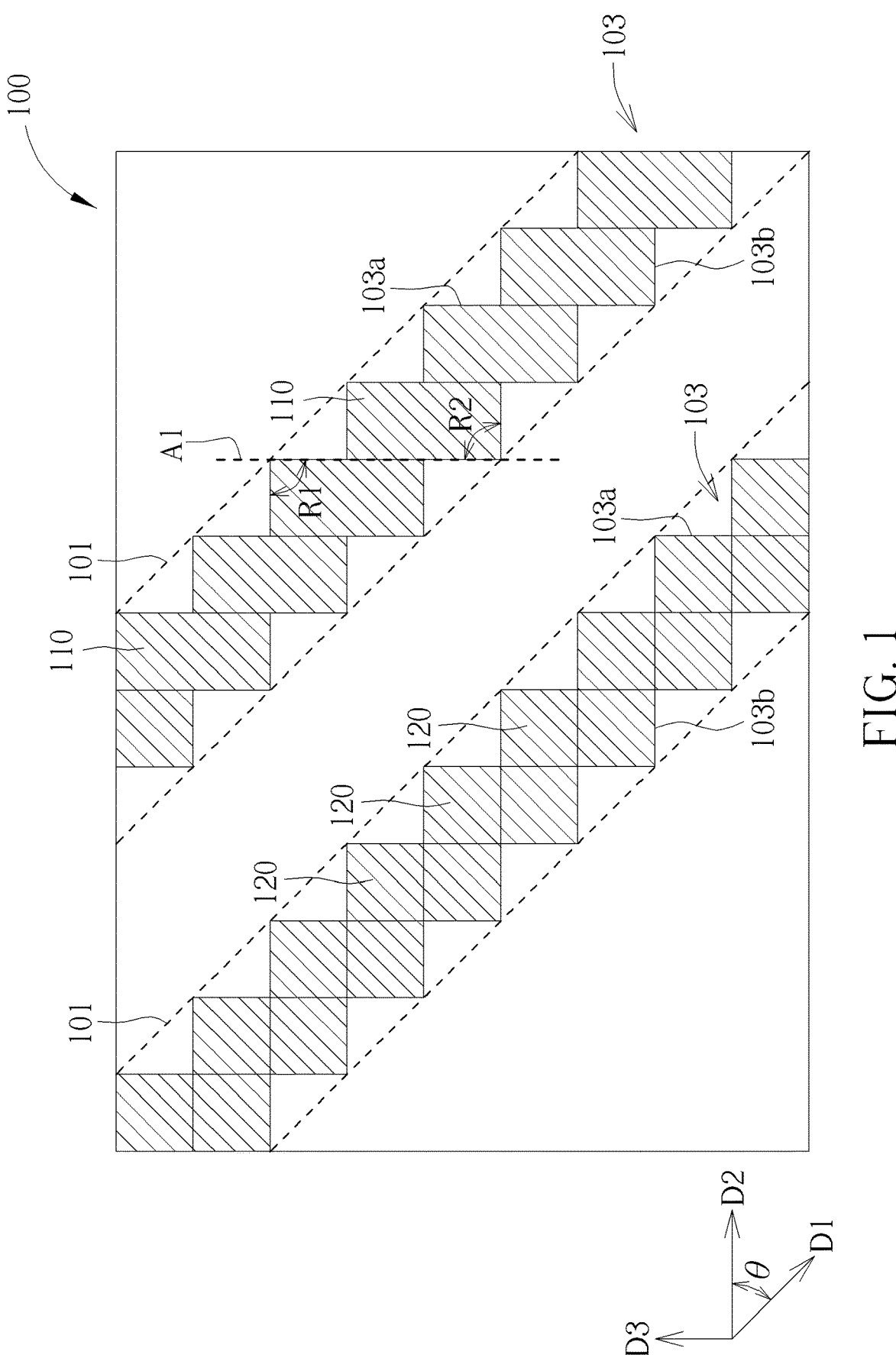
FIG. 1 is a schematic diagram illustrating a method of forming a photomask according to a first embodiment of the present disclosure.

Please refer to FIG. 1, a method of forming a photomask according to the first embodiment of the present disclosure is illustrated, in which a pattern 100 corresponding to a target layout (not shown in the drawings) is inputted and implemented by a computer system (not shown in the drawings), the pattern 100 for example includes a plurality of oblique features 101 which are parallel with each other. The practical quantity of the oblique features 101 may be any possible number based on product requirements, and which is not limited to be two as shown in FIG. 1. In one embodiment, each of the oblique features 101 is extended along a first direction D1 which has an included angle θ with the x-direction or the y-direction (such as a direction D2 as shown in FIG. 1), and the included angle θ is about 35 degrees to 75 degrees, but not limited thereto. Then, as shown in FIG. 1, a plurality of standard patterns is established by the computer system to arrange in an array to simulate the oblique features 101, wherein the standard patterns may include a rectangular pattern 110, a square pattern 120, a regular polygon (not shown in the drawings) or a combination thereof. Preferably, a dimension of each standard pattern is about 10 nanometer (nm) to 50 nm, but is not limited thereto. In this way, the standard patterns are arranged to form a plurality of simulated patterns 103 in a stair-like shape, with each of the simulated patterns 103 having two stair-like edges 103*a*, 103*b* as shown in FIG. 1. Since the simulated patterns 103 is formed by regular polygons (such as the rectangular pattern 110 or the square pattern 120), each of the stair-like edges 103*a*, 103*b* includes a plurality of right angles such as the angles R1, R2 as shown in FIG. 1, and the angle R1 disposed at the stair-like edge 103*a* and the angle R2 disposed at the stair-like edge 103*b* are both located at the same axis A1 which is extended along a direction D3 being perpendicular to the direction D2. In other words, the two angles R1, R2 may be rotational symmetrical with respect to the axis A1.

Following these, all of the standard patterns are processed and outputted through the computer system to form a photomask (not shown in the drawings), with the photomask including a plurality of stair-like patterns (not shown in the drawings) accordingly. Then, a photolithograph process is then performed through the photomask, which may include forming a photoresist layer (not shown in the drawings) over a semiconductor substrate (not shown in the drawings, such as a silicon substrate, a silicon containing substrate or a silicon-on-insulator substrate) according to the photomask, and performing at least one etching process to pattern the semiconductor substrate or a material layer such as a dielectric layer, a semiconductor layer or a conductive layer disposed on the semiconductor substrate, thereby forming a corresponding structure (not shown in the drawings), with the corresponding structure to meet the feature requirements of the target layout (namely the pattern 100).

As the oblique linear patterns may not be directly outputted as a photomask through the computer system, the method of the present embodiment firstly providing the standard patterns (such as the rectangular pattern 110 and/or the square pattern 120) to simulate the oblique linear patterns, and outputting the arranged standard patterns to form the photomask. Through these performances, patterns of the photoresist layer formed thereby may obtain a good profile, increasing the reliability of the corresponding structure formed in the subsequent process. However, if higher pattern accuracy is required for the photomask, the smaller dimension and the greater arranged number of the standard patterns have to be processed by the computer system, dramatically increasing the overall data number processed by the computer system and processing time thereof.

People well known in the arts should easily realize the photomask and the method of forming the same of the present disclosure may further include other examples or varieties. According to another embodiment of the present disclosure, a photomask may be formed by only establishing a peripheral contour of a stair-like pattern instead of defining the whole pattern thereof, so as to reduce the processed data number and processing time of the computer system. Thus, patterns of the photomask obtained in said another embodiment not only has optimized uniformity and improved profile, but also has a simplified and convenient process flow thereof. The following description will detail the different embodiments of the photomask and the method of forming the same in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figures 2, 3:
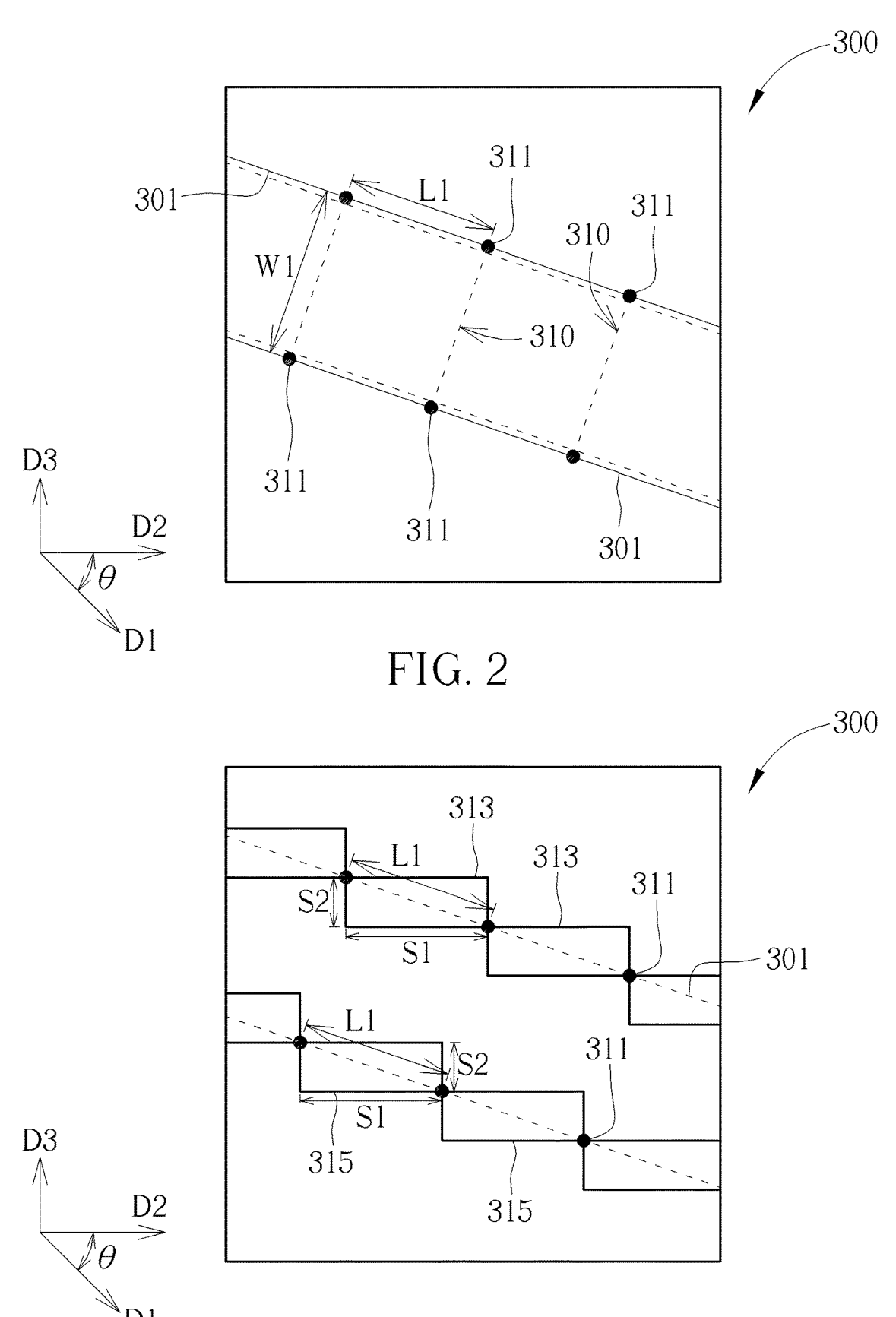

Please refer to FIGS. 2-7, a method of forming a photomask according to the second embodiment of the present disclosure is illustrated. Firstly, as shown in FIG. 2, a pattern 300 corresponding to a target layout (not shown in the drawings) is inputted and implemented by the computer system, and the pattern 300 for example includes at least one oblique features 301. In one embodiment, the oblique feature 301 is extended along the direction D1 which has the included angle θ with the x-direction or the y-direction (such as a direction D2 as shown in FIG. 1), and the included angle θ is about 35 degrees to 75 degrees, but not limited thereto.

Then, a plurality of fragment breaks 310 is defined on the oblique feature 301 by the computer system, with each of the fragment breaks 310 having four endpoints 311 disposed at the two opposite edges of the oblique feature 301, as shown in FIG. 2. Precisely, each of the fragment breaks 310 has a length L1 in the direction D1, and which is defined by two adjacent endpoints 311 disposed at the same edge of the oblique feature 301. Also, two adjacent endpoints 311 respectively disposed at the two opposite edges of the oblique feature 301 define a width W1 of the fragment break 310, and preferably, the width W1 is perpendicular to the length L1 and which is substantially the same as a diameter of the oblique feature 301. It is noted that, the practical quantity of the fragment breaks 310 which is defined on the oblique feature 301, as well as the precise number of the length L1 of each fragment break 310, may both be adjustable based on product requirements. For example, the length L1 of each fragment break 310 may be any possible number greater than zero, and less than a total length of the oblique feature 301 in the direction D1.

As shown in FIG. 3, a plurality of dummy quadrilaterals 313 is identified at one edge of the oblique feature 301 by using the length L1 between two adjacent endpoints 311 disposed at the same edge of the oblique feature 301 as a diagonal line. Likewise, a plurality of dummy quadrilaterals 315 is also identified at the opposite edge of the oblique feature 301. The dummy quadrilaterals 313, 315 may include a square shape or a rectangular shape. For example, each of the dummy quadrilaterals 313, 315 includes a rectangular shape having a longer side S1 in the direction D2 and a shorter side S2 in the direction D3 as shown in FIG. 3, but is not limited thereto.

Figure 4:
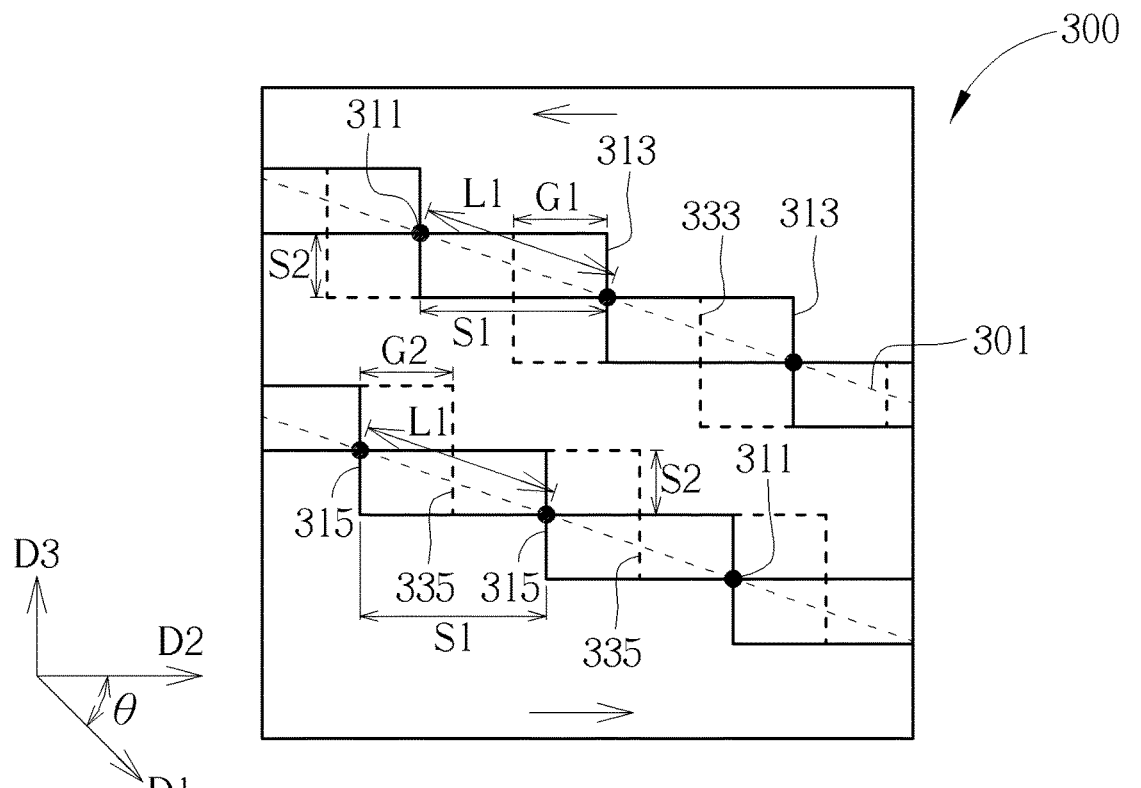

Next, as shown in FIG. 4, each of the dummy quadrilaterals 313 is horizontally shifted by a distance G1 in the direction D2, to form a plurality of quadrilaterals 333, and also, each of the dummy quadrilaterals 315 is horizontally shifted by a distance G2 in the direction D2, to form a plurality of quadrilaterals 335. It is noted that the dummy quadrilaterals 313 and the dummy quadrilaterals 315 are respectively shifted toward two opposite directions. For example, the dummy quadrilaterals 315 are shifted along the direction D2 to form the quadrilaterals 335, and the dummy quadrilaterals 313 are shifted along a direction which is opposite to the direction D2 to form the quadrilaterals 333, as shown in FIG. 4. However, in another embodiment, the dummy quadrilaterals 313 may also be shifted along the direction D2, and then, the dummy quadrilaterals 315 may be shifted along the direction opposite to the direction D2. After the dummy quadrilaterals 313, 315 are horizontally shifted, the quadrilaterals 333, 335 formed thereby may further close to the profile of the oblique feature 301, with each of the quadrilaterals 333, 335 being marked as a dashed box in FIG. 4. In the present embodiment, the shirting distance G1 and/or the distance G2 may include any number greater than zero and smaller than the value of the longer side S1. Preferably, the distance G1 may be the same as the distance G2, so that, the dummy quadrilaterals 313, 315 may include equal shifting distance as shown in FIG. 4, but is not limited thereto. In another embodiment, the two distances G1, G2 may also be different from each other due to practical product requirements, and then, the dummy quadrilaterals disposed on two edges may respectively have different shifting distances.

Figure 5:
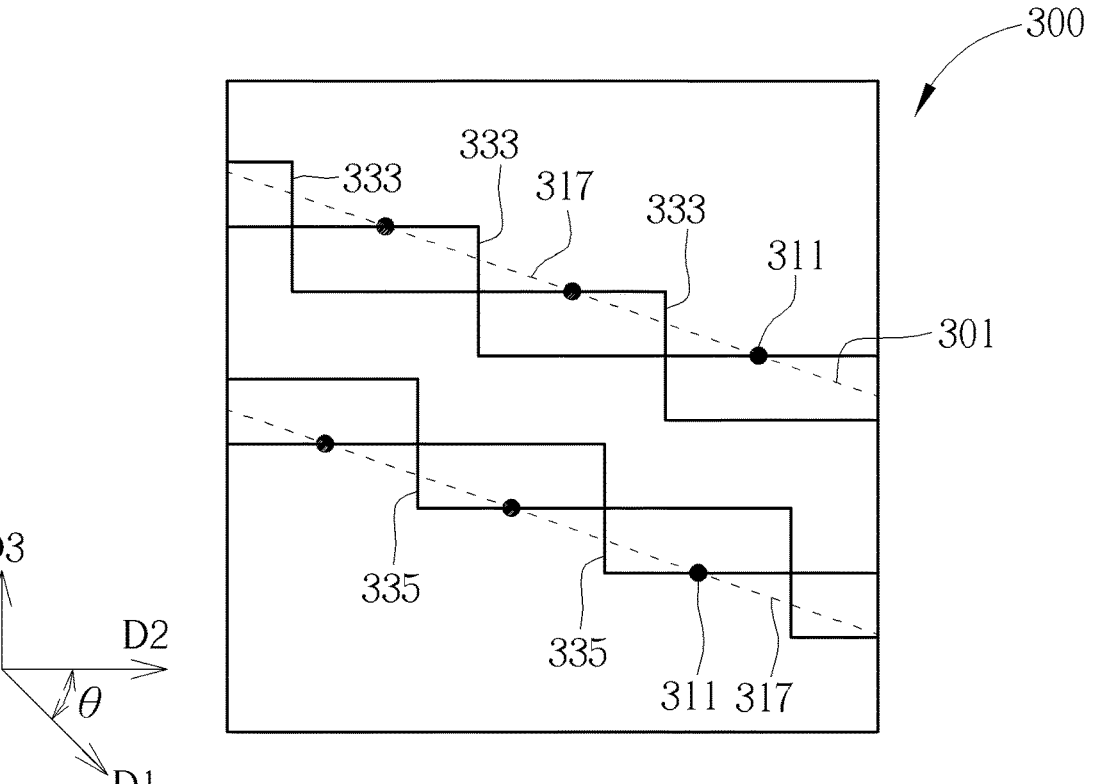
Figure 6:
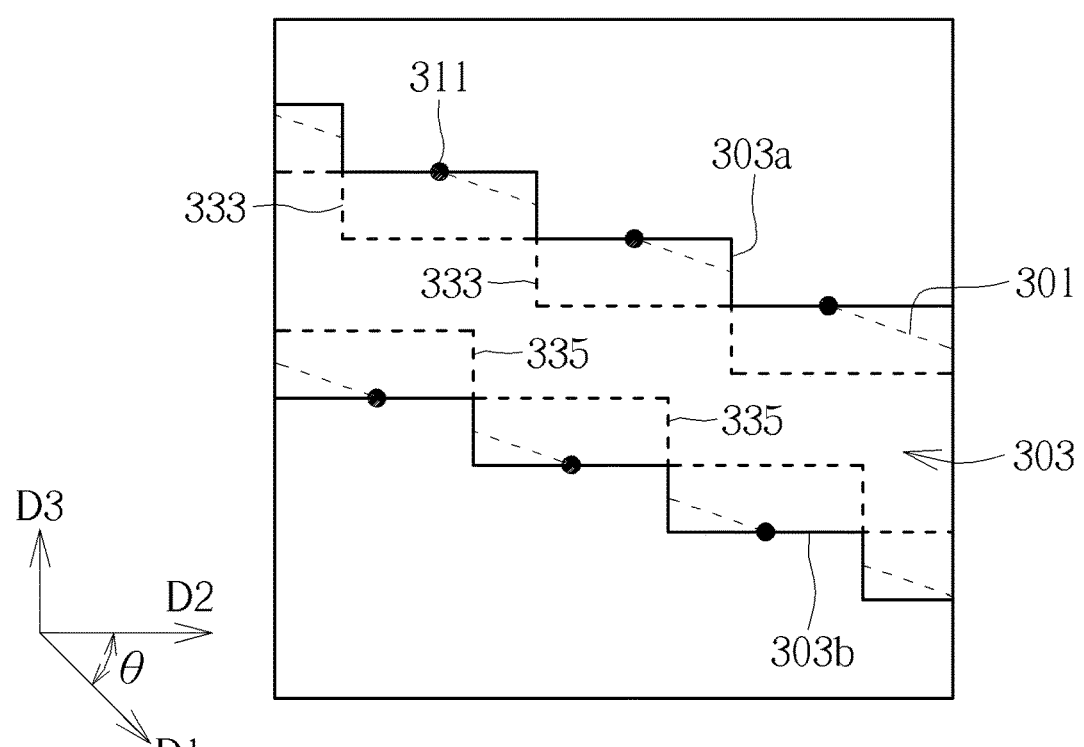

As shown in FIG. 5, after forming the quadrilaterals 333, 335, the dummy quadrilaterals 313, 315 are completely removed, and also, an un-overlapping fragment 317 either between the two edges of the oblique feature 301 and the quadrilaterals 333, or between the two edges of the oblique feature 301 and the quadrilaterals 335 are removed. In other words, a portion of the two edges of the oblique feature 301 which is not covered by the quadrilaterals 333, 335 is erased by the computer system, to only retain the outline of the quadrilaterals 333, 335. Accordingly, a stair-like feature 303 is formed as shown in FIG. 6, and two edges thereof respectively include a stair-like contour 303a/303b.

Figure 7:
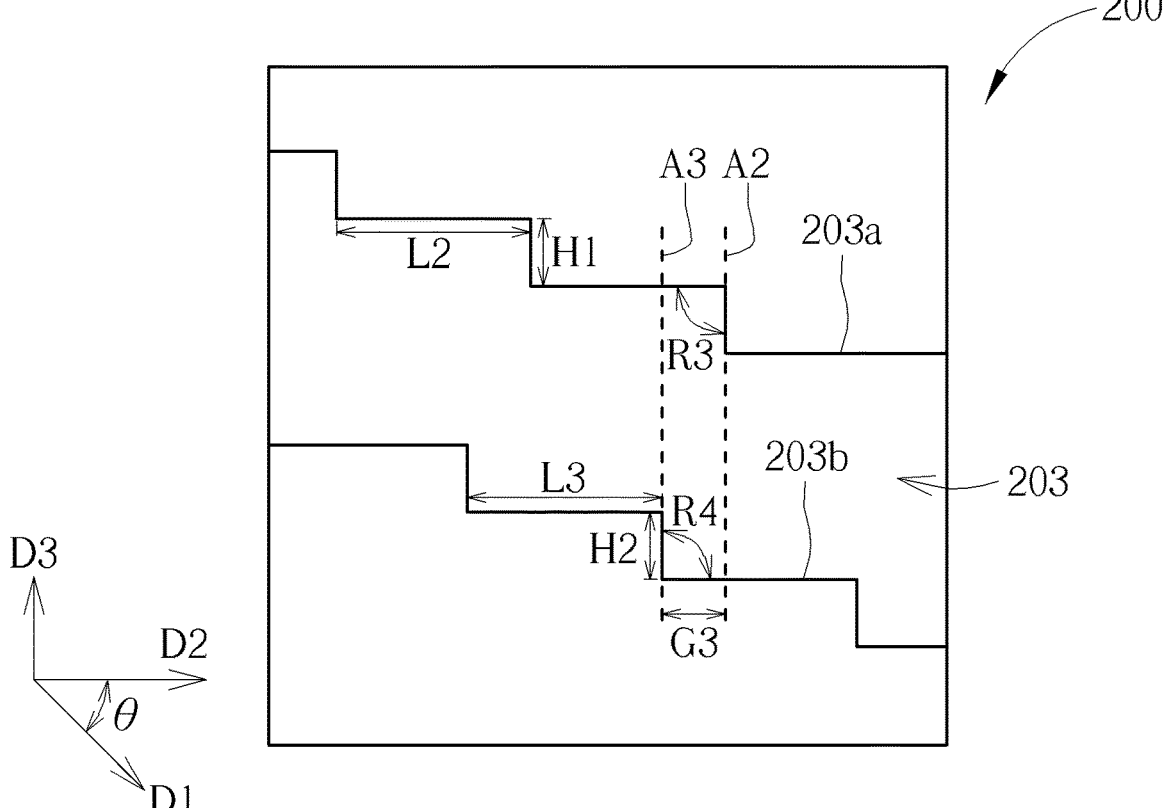

As shown in FIG. 7, the stair-like contours 303a, 303b of the stair-like feature 303 are established and outputted by the computer system to form a photomask 200, and the photomask 200 includes at least one pattern 203 having the corresponding stair-like feature. Precisely, the pattern 203 includes two stair-like edges 203a, 203b, and the stair-like edges 203a includes a plurality of stairs with each of the stair having the same height H1 in the direction D3 and the same length L2 in the direction D2. Likewise, the stair-like edge 203b includes a plurality of stairs, and each of the stairs also has the same height H2 in the direction D3 and the same length L3 in the direction D2. Preferably, the height H1 of each stair of the stair-like edge 203a and the height H2 of each stair of the stair-like edge 203b are the same, and which may both equal to the value of the shorter side S2 of the dummy quadrilaterals 313, 315 (as being shown in FIG. 3). Furthermore, the length L2 of each stair of the stair-like edge 203a and the length L3 of each stair of the stair-like edge 203b are also the same, and which may both equal to the value of the longer side S1 of the dummy quadrilaterals 313, 315 (as being shown in FIG. 3). On the other hand, each of the stair-like edges 203a, 203b includes a plurality of right angles such as the angle R3, R4. It is noted that the angle R3 disposed at the stair-like edge 203a and the angle R4 disposed at the stair-like edge 203b are not located at the same axis such as the axis A2/A3 which is extended along a direction D3, with a distance G3 between the two angles R3, R4 or between the two axis A2, A3 in the direction D2. Following these, a photolithograph process is performed through the photomask 200, to form a corresponding structure (not shown in the drawings) which is allowable to meet the feature requirements of the target layout on the device.

Through the above-mentioned processes, the photomask 200 of the present embodiment is fast and conveniently performed by creating the stair-like boarder instead of a complete picture. Accordingly, the processed data number through the computer system in the present method may be significantly reduced, so as to save more processing time. In addition, the contours of the pattern 203 (namely the stair-like edges 203a, 203b) on the photomask 200 are precisely established through firstly identifying some dummy quadrilaterals 313, 315 followed by horizontally shifting these dummy quadrilaterals 313, 315 for further fitting to the target layout, so that, the pattern 203 of the photomask 200 may obtain an optimized uniformity an smoother profile. Then, patterns of the photoresist layer formed accordingly may therefore obtain smoother and oblique edges in a better quality.

Figure 8:
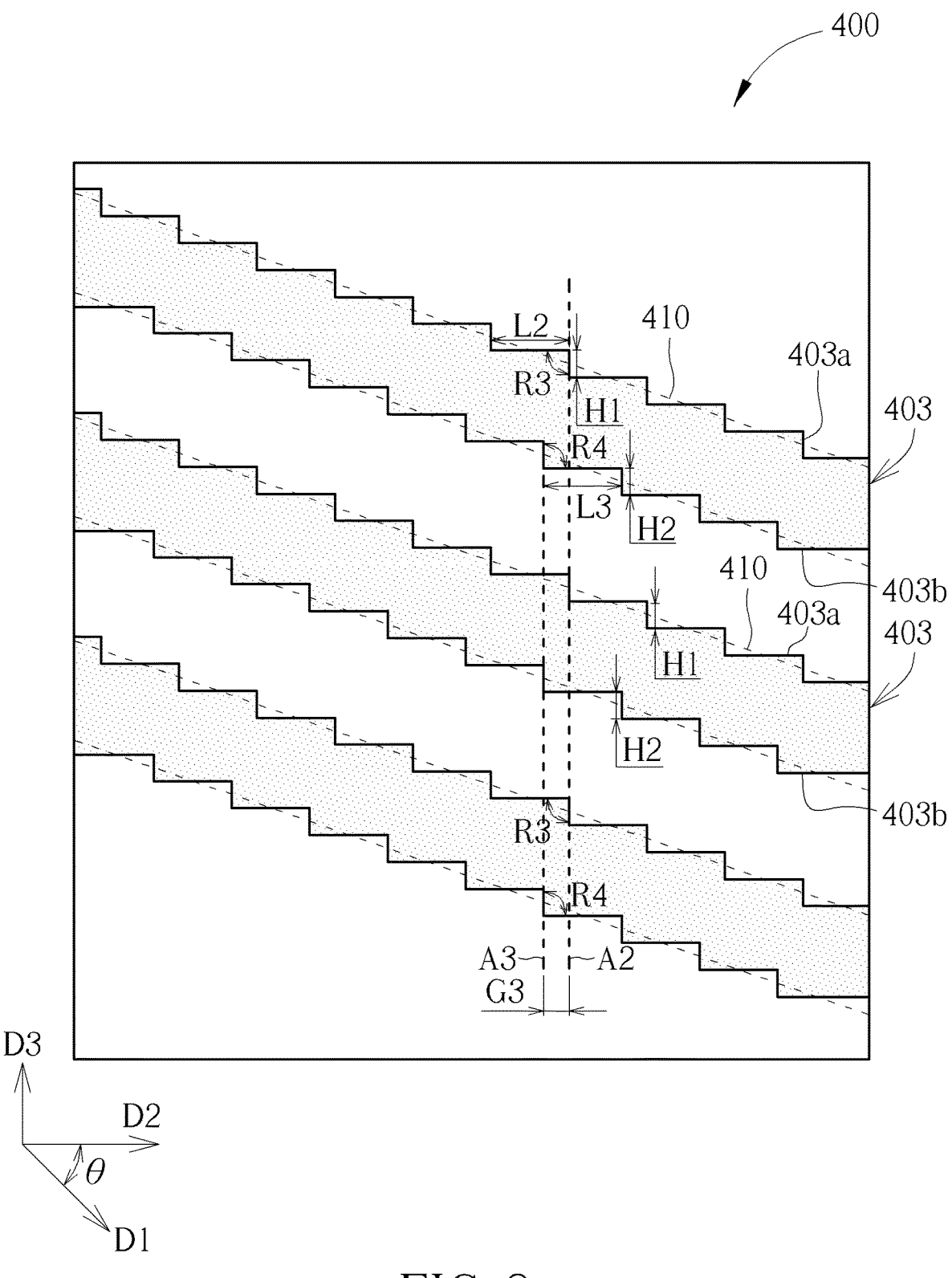
FIG. 8 is a schematic diagram illustrating a photomask according to a preferable embodiment of the present disclosure.

In this way, according to the aforementioned forming method, a photomask 400 as shown in FIG. 8 may be easily provided for forming oblique linear patterns. Precisely, the photomask 400 includes a plurality of stair-like patterns 403, with each of the stair-like patterns 403 being parallel with each other and having two stair-like edges 403a, 403b. People well in the art should easily understand that the practical quantity of the stair-like patterns 403 may be any possible number based on product requirements, and which is not limited to be three as shown FIG. 8. In addition, each one of the stair-like edges 403a includes a plurality of stairs having the same height H1 in the direction D3 and the same length L2 in the direction D2. Likewise, each one of the stair-like edges 403b also includes a plurality of stairs having the same height H2 in the direction D3 and the same length L3 in the direction D2. Preferably, the height H1 of each stairs of the stair-like edge 403a is substantially the same as the height H2 of each stairs of the stair-like edge 403b, and the length L2 of each stairs of the stair-like edge 403a is substantially the same as the length L3 of each stairs of the stair-like edge 403b, but not limited thereto. On the other hands, each of the stair-like edges 403a, 403b includes a plurality of right angles such as the angles R3, R4. It is noted that, each of the angles R3 disposed at the stair-like edges 403a and each of the angles R4 disposed at the stair-like edges 403b are not located at the same axis such as the axis A2/A3 which is extended along a direction D3, with the distance G3 being between the two angles R3, R4, as shown in FIG. 8. It is also noted that, the angles R3 disposed at each stair-like edge 403a of each stair-like pattern 403 or the angles R4 disposed at each stair-like edge 403b of each stair-like pattern 403 may be located at the same axis such as the axis A2/A3, as shown in FIG. 8. In other words, each of the stair-like patterns 403 is in alignment with each other in the direction D3, with the angles R3 at the stair-like edges 403a or the angles R4 at the stair-like edges 403b of any two adjacent stair-like patterns 403 being both located at the same axis such as the axis A2/A3.

Through these arrangements, the stair-like patterns 403 of the photomask 400 in the present embodiment may obtain optimized uniformity and improved profile, and a photoresist layer formed accordingly over a semiconductor substrate may therefore obtain smoother and oblique linear feature in a better quality, for example as the dotted lines 410 shown in FIG. 8, but not limited thereto.

However, people well-skilled in the art should fully understand that, the photomask formed in the present disclosure may further include another layout, which is not limited to be above-mentioned. As shown in FIGS. 9-12, a method of forming a photomask according to the third embodiment of the present disclosure is illustrated, in which the formal steps of the forming method in the third embodiment are substantially the same as those in the second embodiment, with all similarities being not redundantly described hereinafter. The difference between the forming methods of the present embodiment and the aforementioned second embodiment is in that the stair-like feature 303 obtained in FIG. 6 may further undergo an additional adjusting process in the computer system.

Figure 9:
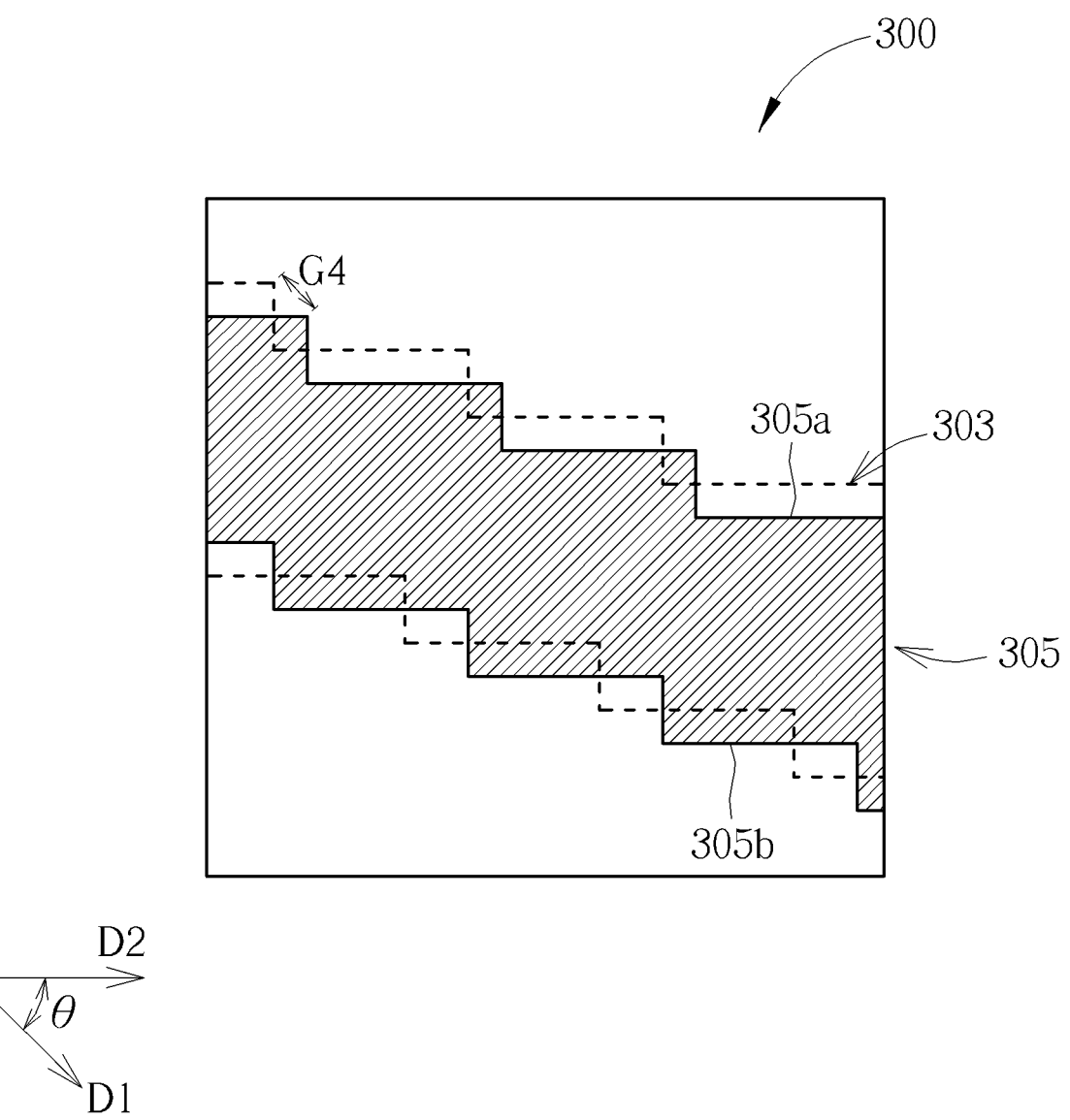

Precisely, as shown in FIG. 9, after obtaining the stair-like feature 303, the adjusting process may be performed by further shifting the stair-like feature 303 by a distance G4 in the direction D1 to form a stair-like feature 305. The stair-like feature 305 also includes two edges with stair-like contours 305a, 305b respectively. Then, after forming the stair-like feature 305, the stair-like contours 305a, 305b of the stair-like feature 305 are established and outputted by the computer system, to form a photomask (not shown in the drawings) with a corresponding stair-like feature. It is noted that if a plurality of the stair-like features 303 as shown in FIG. 6 are provided, the additional shirting process may be performed on at least one stair-like feature 303, such as on the odd numbered one of the stair-like features 303, the even numbered one of the stair-like features 303, or all of the stair-like features 303, thereby obtaining the stair-like features 303 which are not all in alignment with each other in the direction D3. Accordingly, as shown in FIG. 10, a photomask 500 may be formed thereby, and which includes a plurality of stair-like patterns 503, 505 being not in alignment with each other in the direction D3.

Precisely, the stair-like patterns 503, 505 of the photomask 500 are also parallel with each other and have two stair-like edges 503a, 503b/505a, 505b. The features of each stair-like pattern 503/505, such as the height H1/H2 of the stairs, the length L2/L3 of the stairs and the like are all substantially the same as those of the stair-like patterns 403, and which will not be redundantly described hereinafter. It is noted that, the angles R3 disposed at the stair-like edges 503a are located at the same axis such as the axis A2, and the angles R3 disposed at the stair-like edges 503a and the angle R3 disposed at the stair-like edge 505a are not located at the same axis such as the axis A2. Likewise, the angles R4 disposed at the stair-like edges 503b are located at the same axis such as the axis A3, and the angles R4 disposed at the stair-like edges 503b and the angle R4 disposed at the stair-like edge 505b are not located at the same axis such as the axis A3. In other words, the odd numbered stair-like patterns 503 in the photomask 500 are in alignment with each other in the direction D3, and the even numbered stair-like pattern 505 and the odd numbered stair-like patterns 503 are not in alignment with each other in the direction D3, thereby obtaining a diverse layout accordingly, as shown in FIG. 10.

Figure 10:
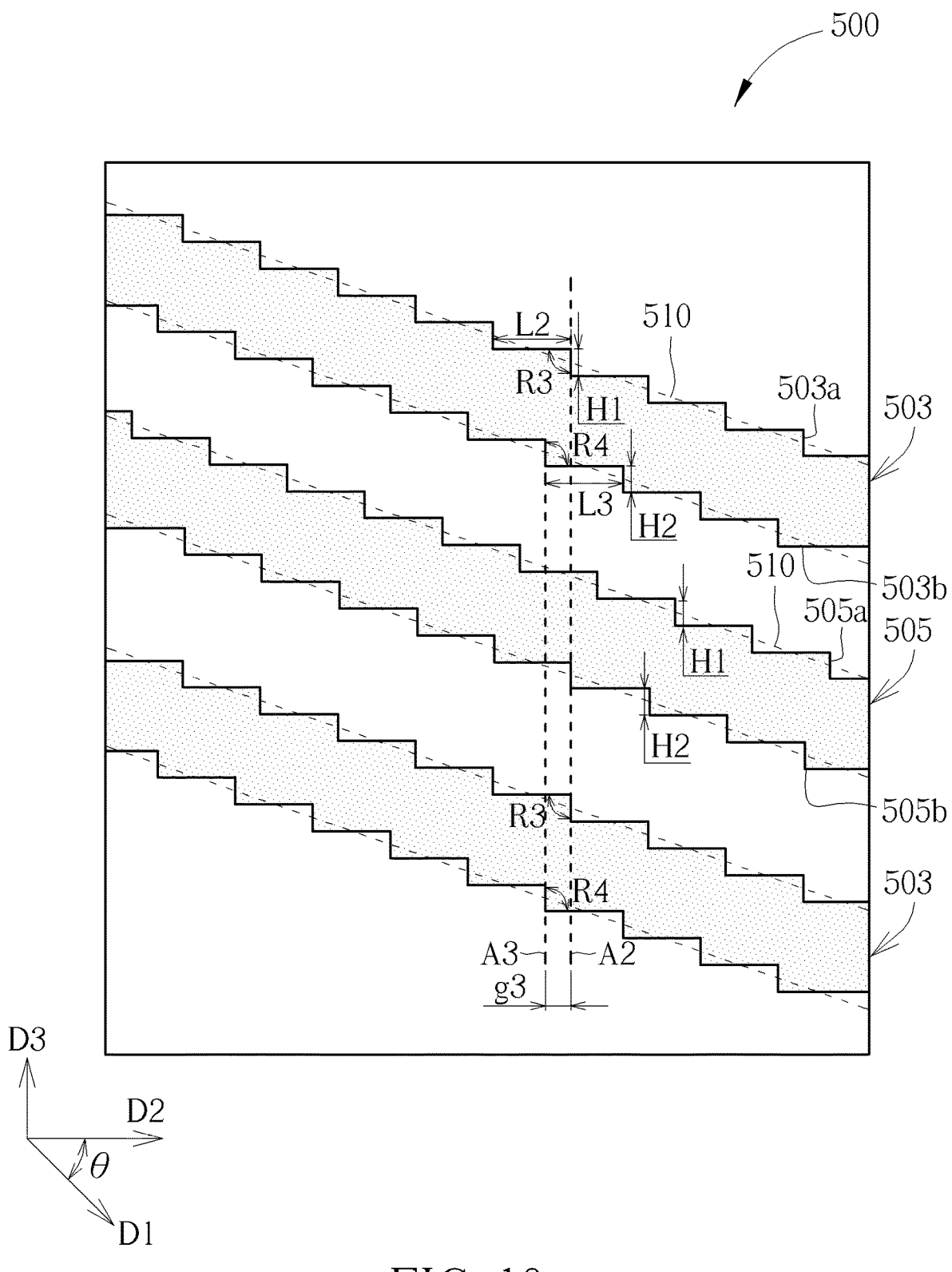

Through these arrangements, the stair-like patterns 503, 505 of the photomask 500 in the present embodiment may also obtain optimized uniformity and improved profile, and a photoresist layer (not shown in the drawings) formed accordingly over a semiconductor substrate (not shown in the drawings) may therefore obtain smoother and oblique linear feature in a better quality, for example as the dotted lines 510 shown in FIG. 10. Furthermore, although the photomask of the present embodiment is exemplified by making the angles R3 or the angle R4 disposed at the odd numbered stair-like patterns 503 being located at the same axis such as the axis A2/A3 along the direction D3, and making angles R3 or the angle R4 respectively disposed at the odd numbered stair-like patterns 503 and the even numbered stair-like patterns 505 being not located at the same axis such as the axis A2/A3 along the direction D3, the practical layout of the photomask in the present disclosure is not limited thereto. In another embodiment, a photomask may also be formed by making the angles R3/R4 disposed at a plurality of the even numbered stair-like patterns 505 being located at the same axis (not shown in the drawings), or making all the angles R3/R4 disposed at different stair-like patterns both not located at the same axis.

Figure 11:
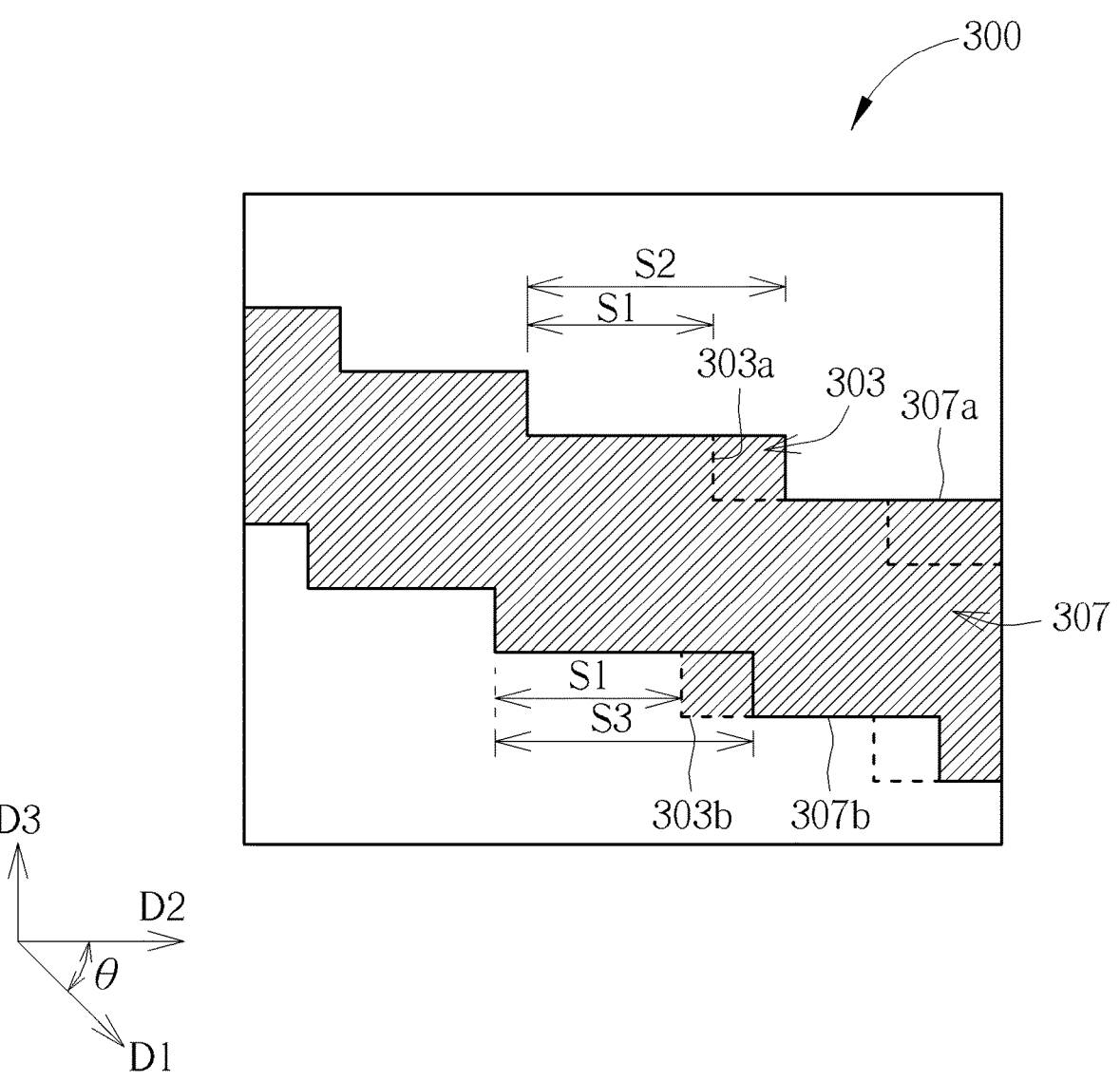

On the other hand, as shown in FIG. 11, the additional adjusting process may also be performed by individually expanding a longer side S1 of at least one stair on the stair-like contours 303a, 303b. In the present embodiment, the longer sides S1 of a stair on the stair-like contour 303a and a corresponding stair on the stair-like contour 303b are simultaneously expanded to form a stair-like feature 307. The stair-like feature 307 also includes two edges with stair-like contours 307a, 307b respectively, and each of the stair-like contours 307a, 307b includes one stair having an expanding side S3, wherein the expanding side S3 is obviously longer than the longer side S2 of the original stairs on the stair-like contour 303a, 303b, in direction D2. After that, the stair-like contours 307a, 307b of the stair-like feature 307 are established and outputted by the computer system, to form a photomask (not shown in the drawings) with a corresponding stair-like feature. It is noted that if a plurality of the stair-like features 303 as shown in FIG. 6 are provided, the individually expanding process may be performed on at least one stair of one stair-like feature 303, a portion of the stair-like features 303, or all of the stair-like features 303, thereby obtaining a more diverse layout of the stair-like features 303. Accordingly, as shown in FIG. 12, a photomask 600 may be formed thereby, and which includes a plurality of stair-like patterns 603, 605 being partially in alignment with each other and partially not in alignment with each other in the direction D3.

Precisely, the stair-like patterns 603, 605 of the photomask 600 are also parallel with each other and have two stair-like edges 603a, 603b/605a, 605b. It is noted that, the stair-like edges 605a, 605b have a stair with an expanding length L4, so that, a portion of the stair-like pattern 605 at the left side of the expanding length L4 are in alignment with adjacent stair-like patterns 603, with the angles R3 disposed at the stair-like edges 603*a*/605*a* being located at the same axis such as the axis A2, and with the angles R4 disposed at the stair-like edges 603*b*/605*b* also located at the same axis such as the axis A3, as shown in FIG. 12. In contrast, another portion of the stair-like pattern 605 at the right side of the expanding length L4 are not in alignment with adjacent stair-like patterns 603, with the angles R3 disposed at the stair-like edges 603*a*/605*a* and the angles R4 disposed at the stair-like edges 603*b*/605*b* both not located at the same axis such as the axis A2, A3 as shown in FIG. 12. In other words, through disposing the expanding length L4 on the stair-like patterns 605, the stair-like patterns 605 may be partially not in alignment with other stair-like patterns 603, thereby obtaining a diverse layout accordingly.

Figure 12:
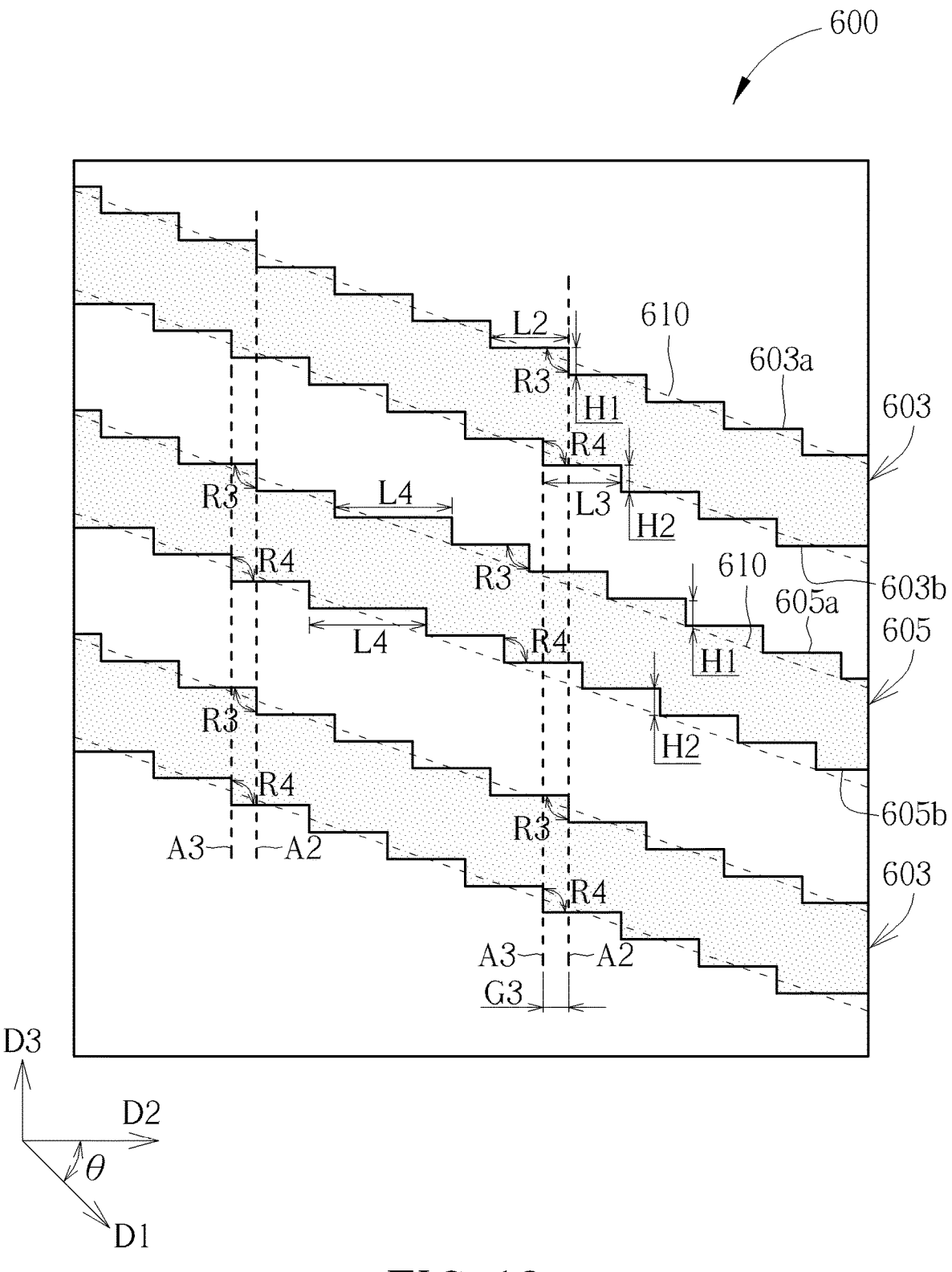

Through these arrangements, the stair-like patterns 603, 605 of the photomask 600 in the present embodiment may also obtain optimized uniformity and improved profile, and a photoresist layer (not shown in the drawings) formed accordingly over a semiconductor substrate (not shown in the drawings) may therefore obtain smoother and oblique linear feature in a better quality, for example as the dotted lines 610 shown in FIG. 12. People in the art should fully understand that, the disposing location, as well as the disposing number, of the expanding length L4 within the photomask 600 of the present embodiment is only for example, and which may be further adjustable based on practical product requirements. For example, the practical disposing locations of the said expanding length L4 may be decided after performing an optical proximity correction process, to further compensate on particular portions of the stair-like patterns 605 to form desired patterns, or to create further diverse layout of photomask to meet the practical product requirements.

Figure 13:
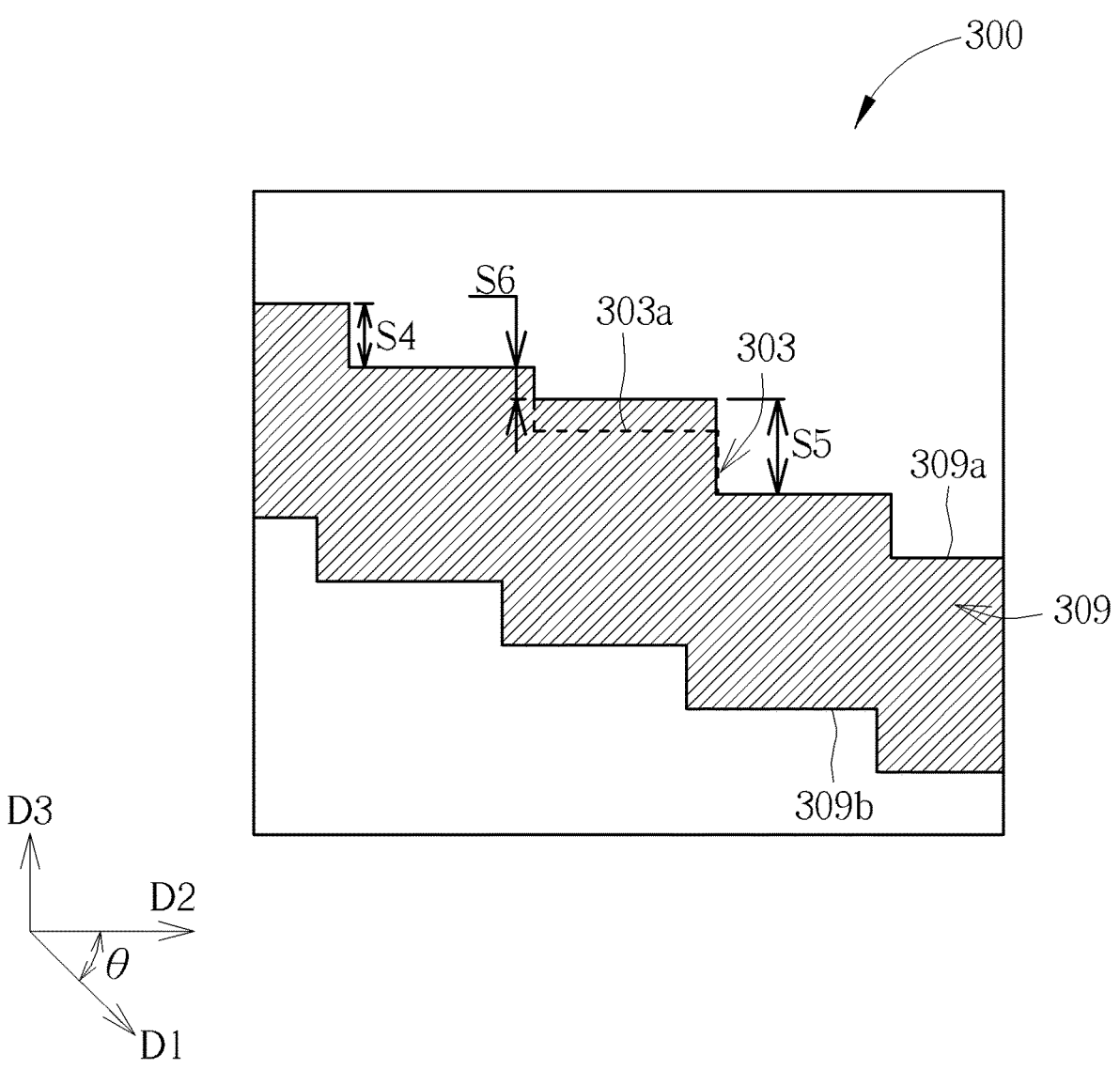

Furthermore, as shown in FIG. 13, the additional adjusting process may also be performed by individually expanding or shrinking a shorter side S4 of at least one stair on the stair-like contours 303*a*, 303*b*. In the present embodiment, one shorter side S4 of a stair on the stair-like contour 303*a* is expanded, and accordingly, another shorter side S4 of the same stair on the stair-like contour 303*a* is shrunk accordingly, to form a stair-like feature 309. The stair-like feature 309 also includes two edges with stair-like contours 309*a*, 309*b* respectively, the stair-like contour 309*a* includes one stair having an expanding side S5 and one shrinking side S6, wherein the expanding side S5 is obviously longer than the shorter side S4 of the original stairs on the stair-like contour 303*a*, 303*b* in direction D3, and the shrinking side S6 is obviously shorter than the shorter side S4 of the original stairs on the stair-like contour 303*a*, 303*b* in direction D3. On the other hand, the stair-like contour 309*b* is substantially the same as the stair-like contour 303*b*, as shown in FIG. 13. After that, the stair-like contours 309*a*, 309*b* of the stair-like feature 309 are established and outputted by the computer system, to form a photomask (not shown in the drawings) with a corresponding stair-like feature.

Figure 14:
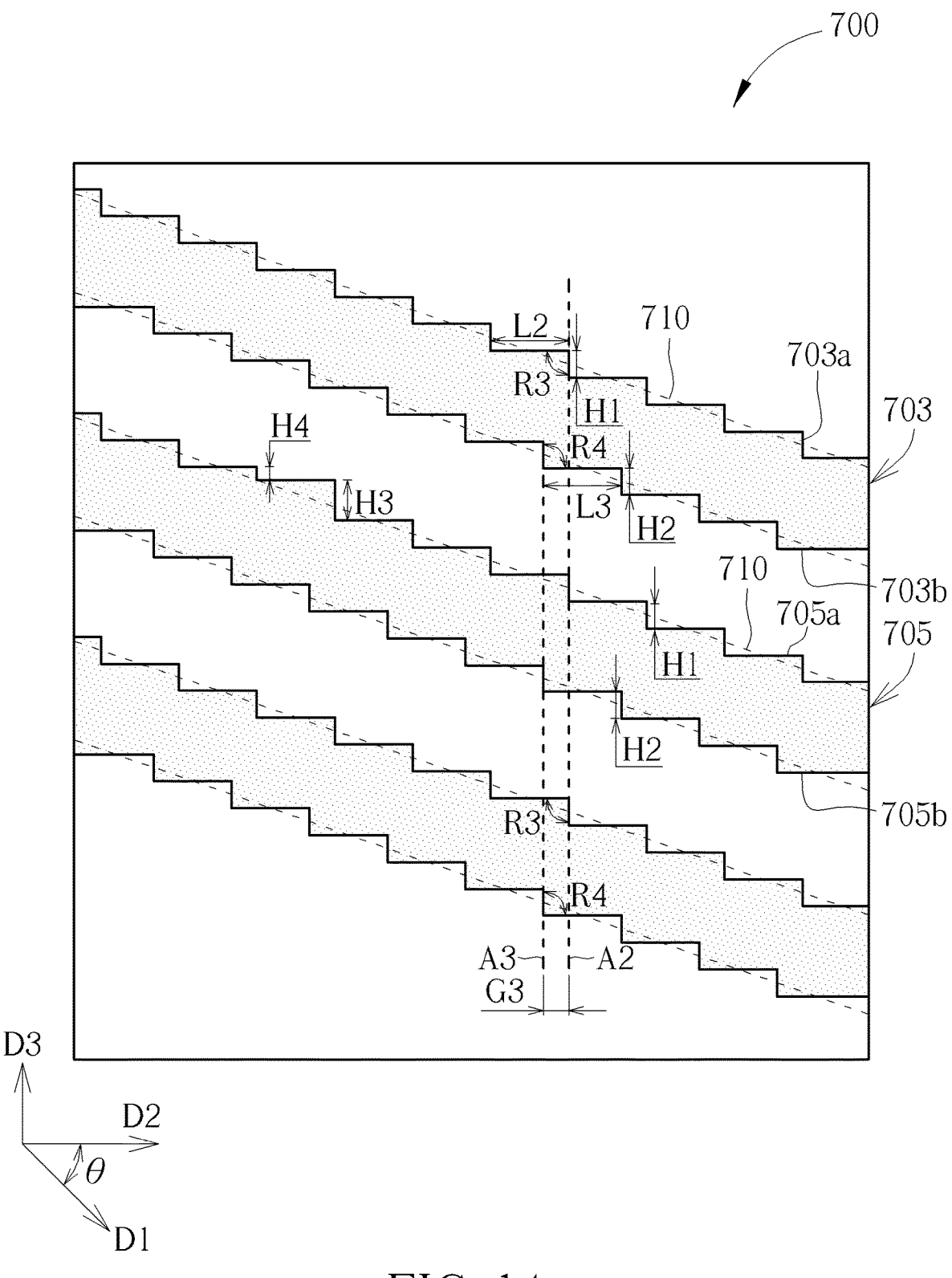

It is noted that if a plurality of the stair-like features 303 as shown in FIG. 6 are provided, the individually expanding/shrinking process may be performed on at least one stair of one stair-like feature 303, a portion of the stair-like features 303, or all of the stair-like features 303, thereby obtaining a more diverse layout of the stair-like features 303. Accordingly, as shown in FIG. 14, a photomask 700 may be formed thereby, and which includes a plurality of stair-like patterns 703, 705 being in alignment with each other in the direction D3. Precisely, the stair-like patterns 703, 705 of the photomask 700 are also parallel with each other and have two stair-like edges 703*a*, 703*b*/705*a*, 705*b*. As shown in FIG. 14, the stair-like edge 705*a* has a stair with an expanding height H3 and a shrinking height H4, so that, the stair-like edges 705*a*, 705*b* of the stair-like pattern 705 may therefore have different heights H1, H2, H3, H4 in the direction D3. However, the stair-like pattern 705 is still in alignment with adjacent stair-like patterns 703, as shown in FIG. 14. People in the art should fully realized that disposing location, as well as the disposing number, of the expanding height H3 and the shrinking height H4 within the photomask 700 of the present embodiment is only for example, and which may be further adjustable based on practical product requirements. For example, the practical disposing locations of the expanding height H3 and the shrinking height H4 may be decided after performing an optical proximity correction process, to further compensate on particular portions of the stair-like patterns 703, 705 to form desired patterns, or to create further diverse layout of photomask to meet the practical product requirements.

Through these arrangements, the stair-like patterns 703, 705 of the photomask 700 in the present embodiment may also obtain further optimized uniformity and improved profile, and a photoresist layer (not shown in the drawings) formed accordingly over a semiconductor substrate (not shown in the drawings) may therefore obtain smoother and oblique linear feature in a better quality, for example as the dotted lines 710 shown in FIG. 14.

Overall speaking, the present disclosure provides a method of forming a photomask for oblique linear patterns, in which the photomask is established by firstly identifying some dummy quadrilaterals followed by horizontal shifting these dummy quadrilaterals to further fit to the target patterns, so that, the photomask obtained thereby may effectively improve the roughness of the pattern edge. Also, since the photomask of the present disclosure is formed by creating the stair-like boarder instead of a complete picture in the computer system, the processed data number through the computer system in the present method may be significantly reduced, so as to save more processing time. Furthermore, the method of the present disclose may further shifting the stair-like boarder or individually expanding/shrinking a length or a height of at least one stair on the stair-like boarder in the additional adjusting process, to form the photomask having stair-like patterns either in alignment with each other or not in alignment with each other, obtaining a diverse layout with further improved patterns accordingly to meet practical product requirements. Thus, a photolithograph process may be easily performed through the photomask of the present disclosure, to form an ideal linear pattern a photoresist layer or on a device, so as to improve the device functions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask (400, FIG. 8), comprising:
   at least one first pattern (403) comprising a first stair-like edge (403*a*) and a second stair-like edge (403*b*) opposite to the first stair-like edge, wherein the first stair-like edge comprises a plurality of first right angles (R3), the second stair-like edge comprises a plurality of second right angles (R4), and one of the first right angles and one of the second right angles nearest thereto are not at a same axis (A2/A3), wherein each of the first stair-like edge (605a) and the second stair-like edge (605b) comprises a plurality of stairs and at least one of the stairs comprises an expanding length (L4) being greater than a length (L2) of other ones of the stairs.

2. The photomask (400, FIG. 8) according to claim 1, wherein there is a distance (G3) between the one of the first right angles and the one of the second right angles nearest thereto.

3. The photomask (400, FIG. 8) according to claim 1, wherein each of the stairs comprises a same height (H1).

4. The photomask (700, FIG. 14) according to claim 1, wherein at least one of the stairs comprises an expanding height (H3) being greater than a height (H1) of other ones of the stairs.

5. The photomask (400, FIG. 8) according to claim 1, wherein a plurality of the first patterns are in alignment with each other.

6. The photomask (500, FIG. 10) according to claim 5, further comprising:

a second pattern (505) comprising a third stair-like edge (505a) and a fourth stair-like edge (505b) opposite to the third stair-like edge (505a), wherein the third stair-like edge comprises a plurality of third right angles (R3), the fourth stair-like edge comprises a plurality of fourth right angles (R4), and one of the third right angles (R3) and one of the fourth right angles (R4) nearest thereto are not at a same axis (A2/A3).

7. The photomask (500, FIG. 10) according to claim 6, wherein the one of the third right angles (R3) on the second patterns (505) and one of the first angles (R3) on the first pattern (503) nearest thereto are not at a same axis (A2/A3).

8. A layout disposed on a semiconductor substrate, comprising:

at least one first pattern comprising a first stair-like edge and a second stair-like edge opposite to the first stair-like edge, wherein the first stair-like edge comprises a plurality of first right angles, the second stair-like edge comprises a plurality of second right angles, and one of the first right angles and one of the second right angles nearest thereto are not at a same axis, wherein each of the first stair-like edge (605a) and the second stair-like edge (605b) comprises a plurality of stairs and at least one of the stairs comprises an expanding length (L4) being greater than a length (L2) of other ones of the stairs.

9. The layout disposed on a semiconductor substrate according to claim 8, wherein there is a distance between the one of the first right angles and the one of the second right angles nearest thereto.

10. The layout disposed on a semiconductor substrate according to claim 8, wherein each of the stairs comprises a same height.

11. The layout disposed on a semiconductor substrate according to claim 8, wherein at least one of the stairs comprises an expanding height being greater than a height of other ones of the stairs.

12. The layout disposed on a semiconductor substrate according to claim 8, wherein a plurality of the first patterns are in alignment with each other.

13. The layout disposed on a semiconductor substrate according to claim 12, further comprising:

a second pattern comprising a third stair-like edge and a fourth stair-like edge opposite to the third stair-like edge, wherein the third stair-like edge comprises a plurality of third right angles, the fourth stair-like edge comprises a plurality of fourth right angles, and one of the third right angles and one of the fourth right angles nearest thereto are not at a same axis.

14. The layout disposed on a semiconductor substrate according to claim 13, wherein the one of third right angles (R3) on the second patterns (505) and one of the first angles (R3) on the first pattern (503) nearest thereto are not at a same axis (A2/A3).

15. A layout disposed on a semiconductor substrate, comprising:

at least one first pattern comprising a first stair-like edge and a second stair-like edge opposite to the first stair-like edge, wherein the first stair-like edge comprises a plurality of first right angles, the second stair-like edge comprises a plurality of second right angles, and one of the first right angles and one of the second right angles nearest thereto are not at a same axis, wherein each of the first stair-like edge (705a) and the second stair-like edge (705b) comprises a plurality of stairs and at least one of the stairs comprises an expanding height (H3) being greater than a height (H1) of other ones of the stairs.

16. The layout disposed on a semiconductor substrate according to claim 15, wherein each of the stairs comprises a same length.

17. The layout disposed on a semiconductor substrate according to claim 15, wherein at least one of the stairs comprises an expanding length being greater than a length of other ones of the stairs.

18. The layout disposed on a semiconductor substrate according to claim 15, further comprising a plurality of the first patterns in alignment with each other.

19. The layout disposed on a semiconductor substrate according to claim 15, further comprising:

a second pattern comprising a third stair-like edge and a fourth stair-like edge opposite to the third stair-like edge, wherein the third stair-like edge comprises a plurality of third right angles, the fourth stair-like edge comprises a plurality of fourth right angles, and one of the third right angles and one of the fourth right angles nearest thereto are not at a same axis.

20. The layout disposed on a semiconductor substrate according to claim 15, wherein there is a distance between the one of the first right angles and the one of the second right angles nearest thereto.

* * * * *